United States Patent [19]
Tada et al.

[11] Patent Number: 5,636,236
[45] Date of Patent: Jun. 3, 1997

[54] SEMICONDUCTOR LASER

[75] Inventors: Kentaro Tada; Hiroyuki Yamazaki, both of Tokyo, Japan

[73] Assignee: NEC Corporation, Tokyo, Japan

[21] Appl. No.: 364,308

[22] Filed: Dec. 27, 1994

[30] Foreign Application Priority Data

Dec. 28, 1993 [JP] Japan .................................. 5-333940
Mar. 22, 1994 [JP] Japan .................................. 6-50830

[51] Int. Cl.$^6$ .................................................. H01S 3/19
[52] U.S. Cl. ................................................ 372/45; 257/18
[58] Field of Search ............................. 372/45; 257/17, 257/18

[56] References Cited

U.S. PATENT DOCUMENTS 4,839,899 6/1989 Burnham et al. ......................... 372/45

FOREIGN PATENT DOCUMENTS

| 0 280 281 | 8/1988 | European Pat. Off. . |
| 2 702 602 | 9/1994 | France . |
| 62-86782 | 4/1987 | Japan . |
| 2-192785 | 7/1990 | Japan . |
| 3-214683 | 9/1991 | Japan . |
| 5-335682 | 12/1993 | Japan . |
| 2 212 325 | 7/1989 | United Kingdom . |

OTHER PUBLICATIONS

Y. Ueno et al., "30-mW 690-nm High-Power Strained-Quantum-Well AlGaInP Laser," *IEEE Journal of Quantum Electronics*, vol. 29, No. 6, Jun. 1993, pp. 1851–1855.

S. Kawata et al., "Room-Temperature Continuous-Wave Operation of A 640 nm AlGaInP Visible-Light Semiconductor Laser," *Electronics Letters*, vol. 23, No. 24, Nov. 19, 1987, pp. 1327–1328.

P. J. Williams et al. "Effect of Barrier Width on Performance of Long Wavelength GaInAs/InP Multi-Quantum-Well Lasers" Electronics Letters, vol. 24, No. 14, Jul. 7, 1988, Stevenage, Great Britian, pp. 859–860.

*Primary Examiner*—Rodney B. Bovernick
*Assistant Examiner*—Yisun Song
*Attorney, Agent, or Firm*—Burns, Doane, Swecker & Mathis, LLP

[57] ABSTRACT

It is the object of the invention to provide a semiconductor laser with a low threshold lasing current and a high external differential quantum efficiency. A n-type AlGaInP clad layer 2, a AlGaInP MQW active layer 3, a p-type AlGaInP clad layer 4, p-type GaInP hetero-buffer layer 5 and a-type GaAs layer 6 are successively grown on a n-type GaAs substrate 1, wherein Al contents of a barrier in the MQW layer 3 is so varied that holes are uniformly distributed in each quantum well. Next, a mesa is formed by an etching process, then a n-type GaAs block layer 7 is grown, and electrodes are formed on both p and n-side surfaces. Finally, the processed substrate is cleaved, and laser diodes are obtained therefrom. An Al content of the barrier layer in the MQW active layer 3 is slowly decreased from a p-side to a n-side, and thereby holes are uniformly distributed in each quantum well and few electrons overflow a quantum well. The selected drawing is FIG. 6.

2 Claims, 14 Drawing Sheets

- 9 SiO₂ FILM
- 6 p-GaAs CAP LAYER
- 5 p-Ga$_{0.5}$In$_{0.5}$P HETERO-BUFFER LAYER
- 4 p-(Al$_{0.6}$Ga$_{0.4}$)$_{0.5}$In$_{0.5}$P CLAD LAYER
- 3 MQW ACTIVE LAYER
- 2 n-(Al$_{0.6}$Ga$_{0.4}$)$_{0.5}$In$_{0.5}$P CLAD LAYER
- 1 n-GaAs SUBSTRATE

FIG.2B PRIOR ART

FIG.2D PRIOR ART 7 n-GaAs BLOCK LAYER

FIG.2C PRIOR ART

FIG.2E PRIOR ART 8 p-GaAs CONTACT LAYER

- 9 SiO₂ FILM
- 6 p-GaAs CAP LAYER
- 5 p-Ga$_{0.5}$In$_{0.5}$P HETERO-BUFFER LAYER
- 4 p-(Al$_{0.6}$Ga$_{0.4}$)$_{0.5}$In$_{0.5}$P CLAD LAYER
- 3 MQW ACTIVE LAYER
- 2 n-(Al$_{0.6}$Ga$_{0.4}$)$_{0.5}$In$_{0.5}$P CLAD LAYER
- 1 n-GaAs SUBSTRATE

FIG.5B

FIG.5D 7 n-GaAs BLOCK LAYER

FIG.5C

FIG.5E 8 p-GaAs CONTACT LAYER

SEMICONDUCTOR LASER

FIELD OF THE INVENTION

The invention relates to a semiconductor laser, especially to a semiconductor laser with a Multiple Quantum Well (MQW, hereinafter) active layer.

BACKGROUND OF THE INVENTION

A semiconductor laser has many attractive applications as a light source in optelectronic equipments including high-density optical disc systems, high speed laser printers, high bit-rate optical communication systems and optical control systems. Considerable effort has been applied to improve characteristics of a semiconductor laser, especially to reduce a threshold lasing current and to increase a external differential quantum efficiency. One of promising means for improving the above mentioned characteristics is a MQW active layer to be used in the semiconductor laser. The MQW active layer commonly used in a semiconductor laser at present has such a structure that a composition, a width, barrier heights and a period of placement of each quantum well are equal respectively in the MQW active layer. However, disadvantages of the semiconductor laser containing the above mentioned MQW active layer is that carriers cannot be uniformly distributed in each quantum well, and satisfactory improvements of a threshold lasing current, an external differential quantum efficiency and other important characteristics cannot be achieved. Then, further improvements of the MQW active layer are extremely desirable.

SUMMARY OF THE INVENTION

Accordingly, it is an object of the invention to provide a semiconductor laser with a MQW active layer, in which characteristics of the semiconductor laser are improved by varying an energy gap in a quantum well layer.

It is a further object of the invention to provide a semiconductor laser with a MQW active layer, in which characteristics of the semiconductor laser are improved by varying an energy gap in a barrier layer.

It is a still further object of the invention to provide a semiconductor laser with a MQW active layer, in which characteristics of the semiconductor laser are improved by varying a strain in a quantum well layer.

It is a yet still further object of the invention to provide a semiconductor laser with a MQW active layer, in which characteristics of the semiconductor laser are improved by varying a width of a quantum well layer.

It is an additional object of the invention to provide a semiconductor laser with a MQW active layer, in which characteristics of the semiconductor laser are improved by varying a width of a barrier layer.

According to the first feature of the invention, a semiconductor laser according to the invention comprises:

a multiple quantum well active layer in which energy gaps in quantum well layers are expressed by a monotonous function, being either increasing or decreasing, between p and n-type clad layers, and the p and n-type clad layers having smaller refractive indexes compared with that of the multiple quantum well active layer.

According to the second feature of the invention, a semiconductor laser according to the invention comprises:

a multiple quantum well active layer in which energy gaps in barrier layers are expressed by a monotonous function, being either increasing or decreasing, between p and n-type clad layers, and the p and n-type clad layers having smaller refractive indexes compared with that of the multiple quantum well active layer.

According to the third feature of the invention, a semiconductor laser according to the invention comprises:

a multiple quantum well active layer in which strains in quantum well layers are expressed by a monotonous function, being either increasing or decreasing, between p and n-type clad layers, and the p and n-type clad layers having smaller refractive indexes compared with that of the multiple quantum well active layer.

According to the fourth feature of the invention, a semiconductor laser according to the invention comprises:

a multiple quantum well active layer in which a width of quantum layers are expressed by a monotonous function, being either increasing or decreasing, between p and n-type clad layers, and the p and n-type clad layers having smaller refractive indexes compared with that of the multiple quantum well active layer.

According to the fifth feature of the invention, a semiconductor laser according to the invention comprises:

a multiple quantum well active layer in which a width of barrier layers are expressed by a monotonous function, being either increasing or decreasing, between p and n-type clad layers, and the p and n-type clad layers having smaller refractive indexes compared with that of the multiple quantum well active layer.

BRIEF DESCRIPTION OF THE DRAWINGS

The preferred embodiments according to the invention will be explained in more detail referring to the appended drawings, wherein.

DESCRIPTION OF THE PREFERRED EMBODIMENTS

Before explaining a semiconductor laser in the preferred embodiments according to the invention, a conventional semiconductor laser will be explained referring to FIGS. 1–3.

Recently, a AlGaInP semiconductor laser, which is fabricated by a Metal-Organic Vapour-Phase Epitaxy (MOVPE, hereinafter) method, has a structure shown in FIG. 1 and oscillates in a single transverse mode, has been reported by Y. Ueno and others on a paper entitled "30 mW 690 nm High-Power Strained-Quantum-well AlGaInP" shown on IEEE J. Quantum Electronics. Vol. 29, 1851–1856 (1993).

Figure 1:
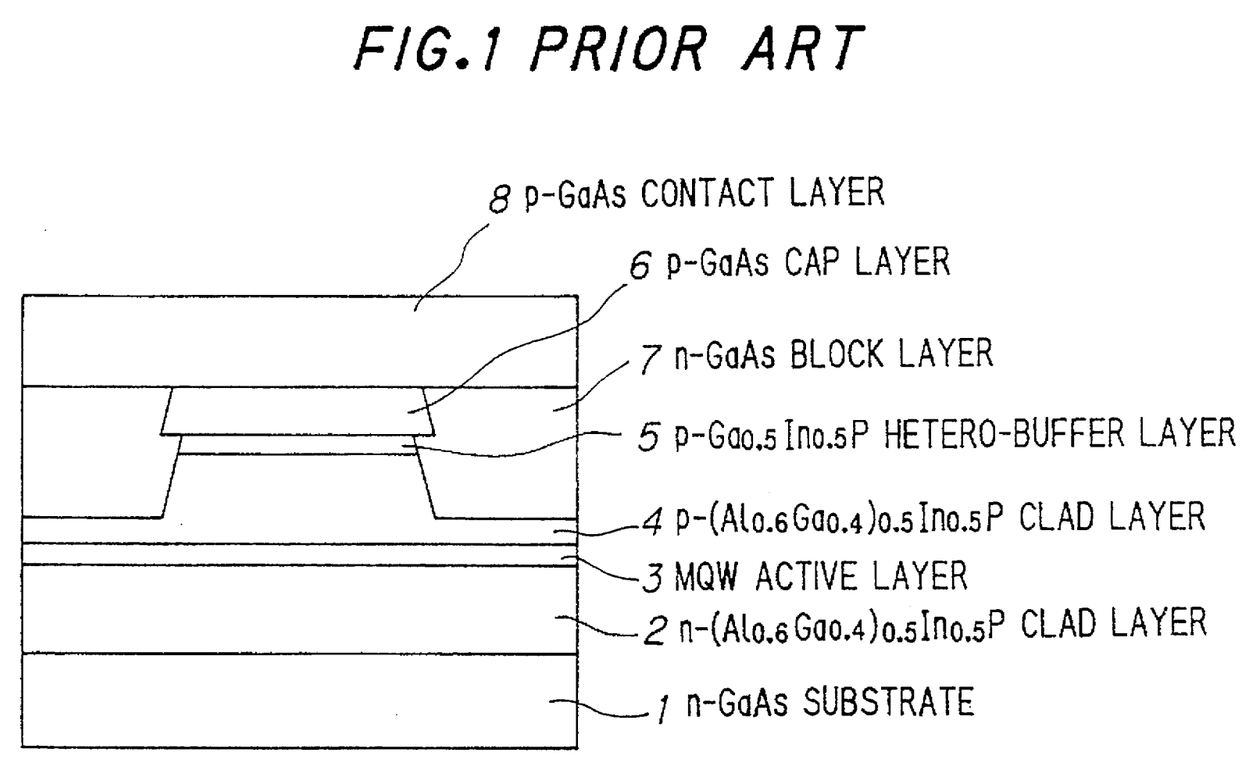
FIG. 1 shows across-sectional view for explaining a structure of a conventional semiconductor laser.

A process of fabricating this structure is shown in FIG. 1. In the first-step growth, a n-type $(Al_{0.6}Ga_{0.4})_{0.5}In_{0.5}P$ clad layer 2, a multiple quantum well active layer 3 composed of well layers of $Ga_{0.5}In_{0.5}P$ and barrier layers of $(Al_{0.6}Ga_{0.4})_{0.5}In_{0.5}P$, a p-type $(Al_{0.6}Ga_{0.4})_{0.5}In_{0.5}P$ clad layer 4, a p-type $Ga_{0.5}In_{0.5}P$ buffer layer 5 and a P-type GaAs cap layer 6 are successively grown on a n-type GaAs substrate 1.

Figure 2A:
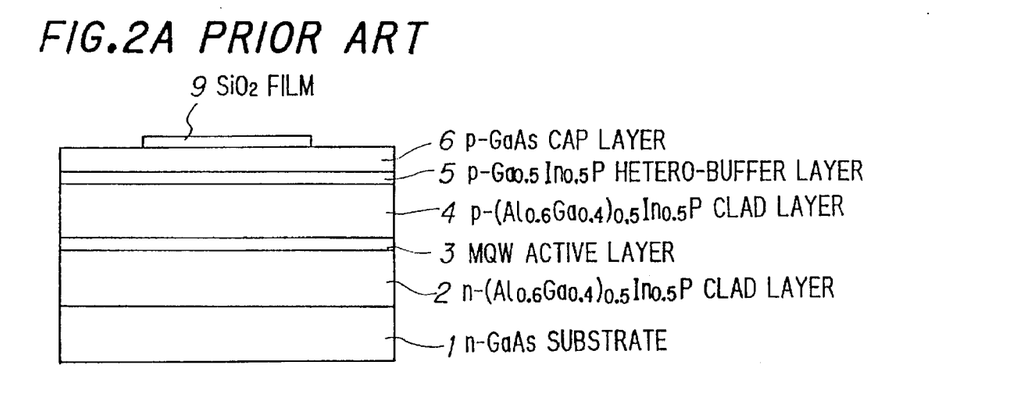
FIGS. 2A to 2E show a process of fabricating a conventional semiconductor laser.
Figure 2B:
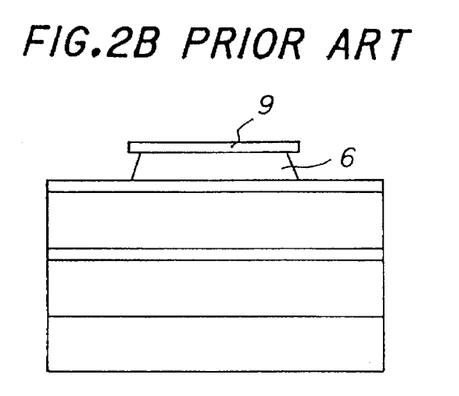
Figure 2C:
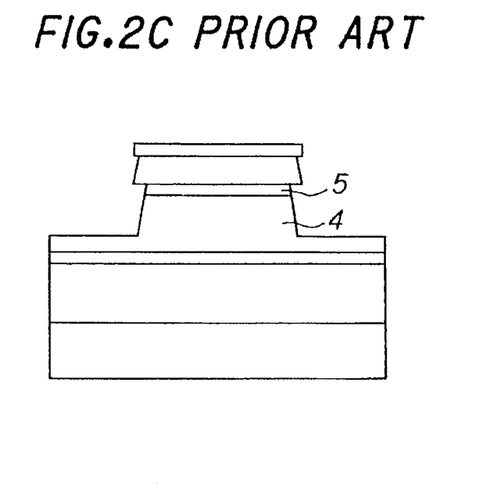
Figure 2D:
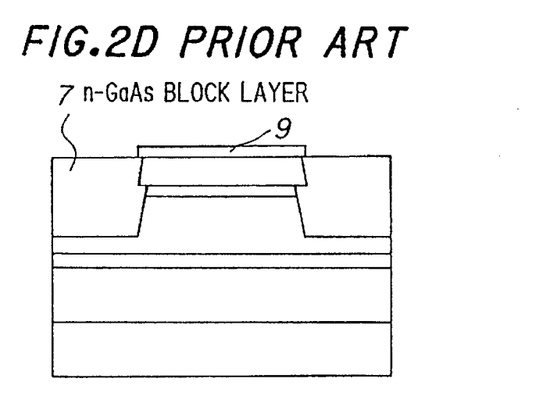
Figure 3:
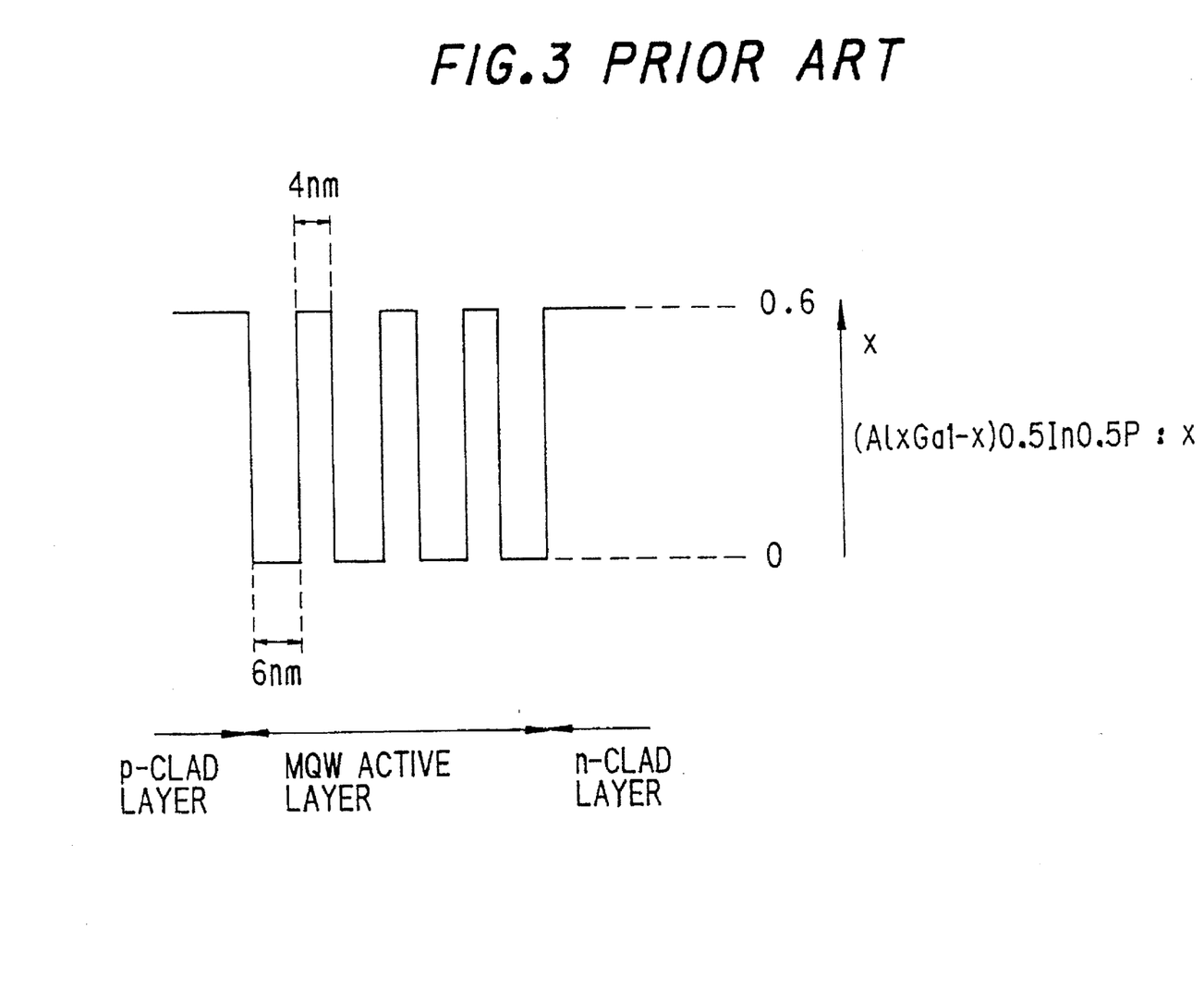
FIG. 3 is a drawing for explaining a structure of the active layer of the conventional semiconductor laser.

On a processed substrate thus obtained, a 5 μm wide stripe-shaped $SiO_2$ film 9, serving as a mask, is formed by photolithography, as shown in FIG. 2A. Next, the p-type GaAs cap layer 6 is etched into a mesa-shape using the $SiO_2$ film 9 as a mask and phosphoric acid as a liquid etchant, as shown in FIG. 2B. Next, the p-type $(Al_{0.6}Ga_{0.4})_{0.5}In_{0.5}P$ clad layer is etched into a mesa-shape part of the way using bromic acid as a liquid etchant, as shown in FIG. 2C. Then, leaving the $SiO_2$ mask 9 as it is, the second-step growth is progressed, and the etched portion is buried with a n-type GaAs block layer 7, as shown in FIG. 2D.

Figure 2E:
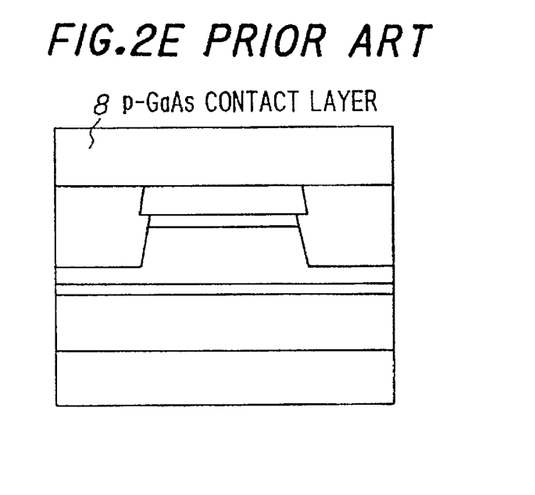

Next, the $SiO_2$ mask 9 is removed, and a p-type GaAs contact layer 8 is so grown that an electrode can be formed over its upper surface by the third-step growth, as shown in FIG. 2E.

The semiconductor laser is completed with the formation of the electrodes on surfaces of the p-type contact layer 8 and the substrate 1. FIG. 3 shows a structure and a composition of a multiple quantum well active layer 3.

In the above mentioned semiconductor laser, the active layer has a MQW structure, and a quantum effect arises in a carrier energy distribution in the active layer by a current injection, and a threshold lasing current can be reduced compared with that of a ordinary semiconductor laser with a bulk-type active layer.

In the MQW structure, which is used as the active layer 3 in the structure shown in FIG. 2, compositions of barrier layers are the same throughout whole barrier layers. Accordingly, when a current is injected to the active layer with many quantum wells, a hole distribution is small in a well being close to the n-type clad layer, and a nonuniform hole injection aries in the active layer. Subsequently, a light emitting efficiency in the active layer is reduced, the threshold lasing current becomes high as compared with those in a case of a uniform distribution, and an external differential quantum efficiency is reduced.

As described in the above, it is extremely important to overcome disadvantages caused by a nonuniform hole injection, and to provide a semiconductor laser with a lower threshold lasing current and a higher external differential quantum efficiency compared with those of a conventional semiconductor laser with a MQW active layer, by making holes be uniformly distributed over the MQW active layer.

It is the feature of the invention that compositions, widths and strains of quantum well and barrier layers are different in a MQW active layer. For example, a barrier layer closer to the n-type clad layer has a smaller energy gap, and therefore, holes can easily cross over a barrier close to the n-type clad layer and get into an adjacent well, and holes can be distributed in quantum well layers close to the n-type clad layer. On the other hand, in a case that a barrier layer closer to the p-type clad layer has a smaller energy gap, a well, which is close to the p-type clad layer, contains many holes and easily overflows, and holes are transmitted sufficiently to wells close to the n-type clad layer, and an biased distribution of holes in the MQW structure can be equalized.

Since expanding an energy gap in a quantum well layer is equivalent to narrowing an energy gap in a barrier layer, the biased distribution of holes can be equalized by changing an energy gap in a quantum well layer in the MQW structure. Similarly, it is also possible to equalize the hole distribution by controlling a rate of overflow of holes in the MQW structure by changing a strain and a width of a quantum well. Moreover, it is possible to equalize the hole distribution by intentionally making a thickness of a barrier layer close to a quantum well layer, which contains a large number of holes, be thin and positively using the tunneling effect. By achieving the uniform hole distribution in the MQW active layer adopting the aforementioned structure, the threshold lasing current can be reduced, and the external differential quantum efficiency can be improved.

Figure 4:
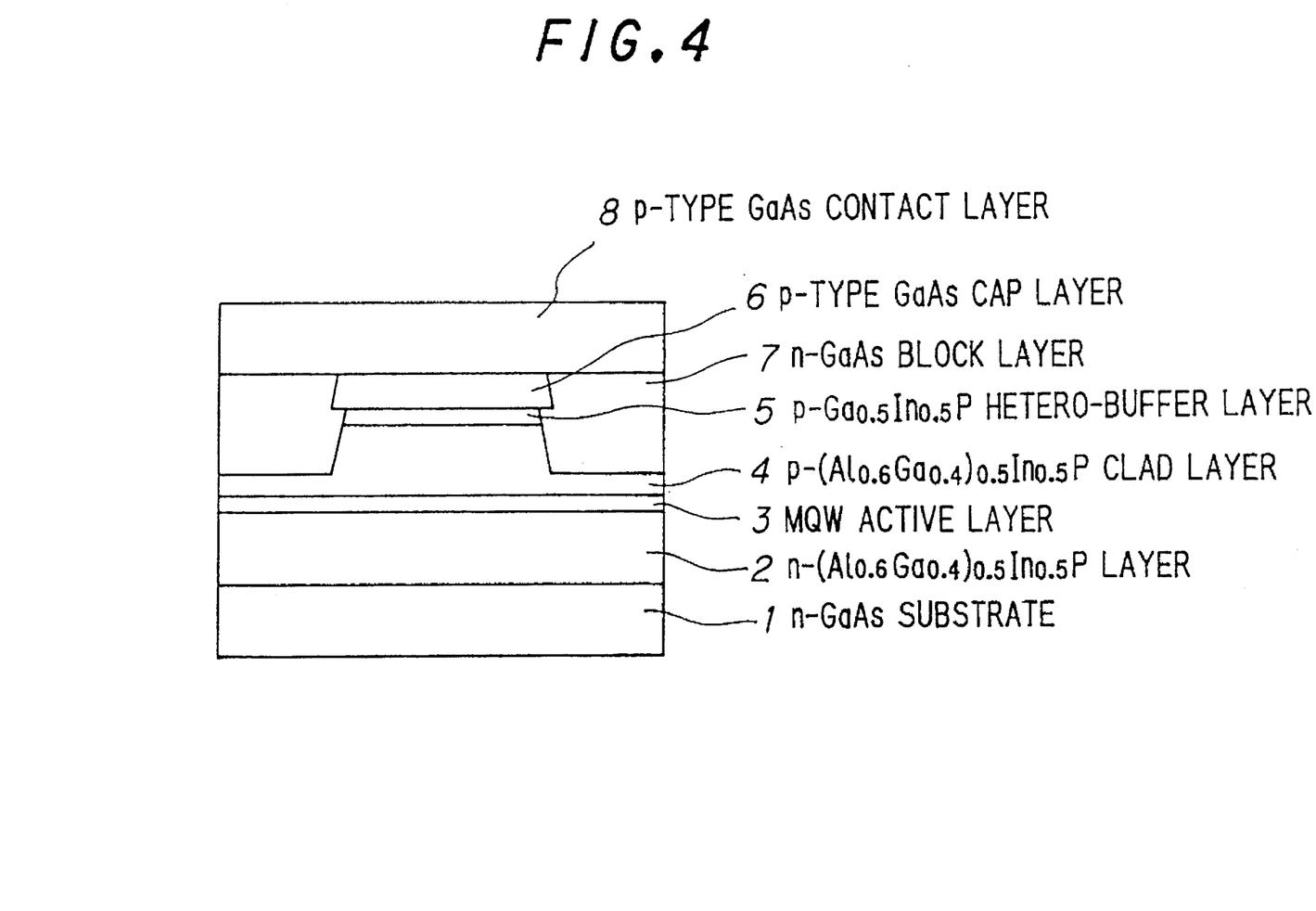
FIG. 4 shows a cross-sectional view of a semiconductor laser as an preferred embodiment of the invention.

Next, the preferred embodiments according to the invention will be explained in conjunction with the appended drawings. FIG. 4 is a cross-sectional view showing a laser chip of a semiconductor laser according to the invention, and FIG. 5 shows a fabricating process of this laser chip.

Figure 6:
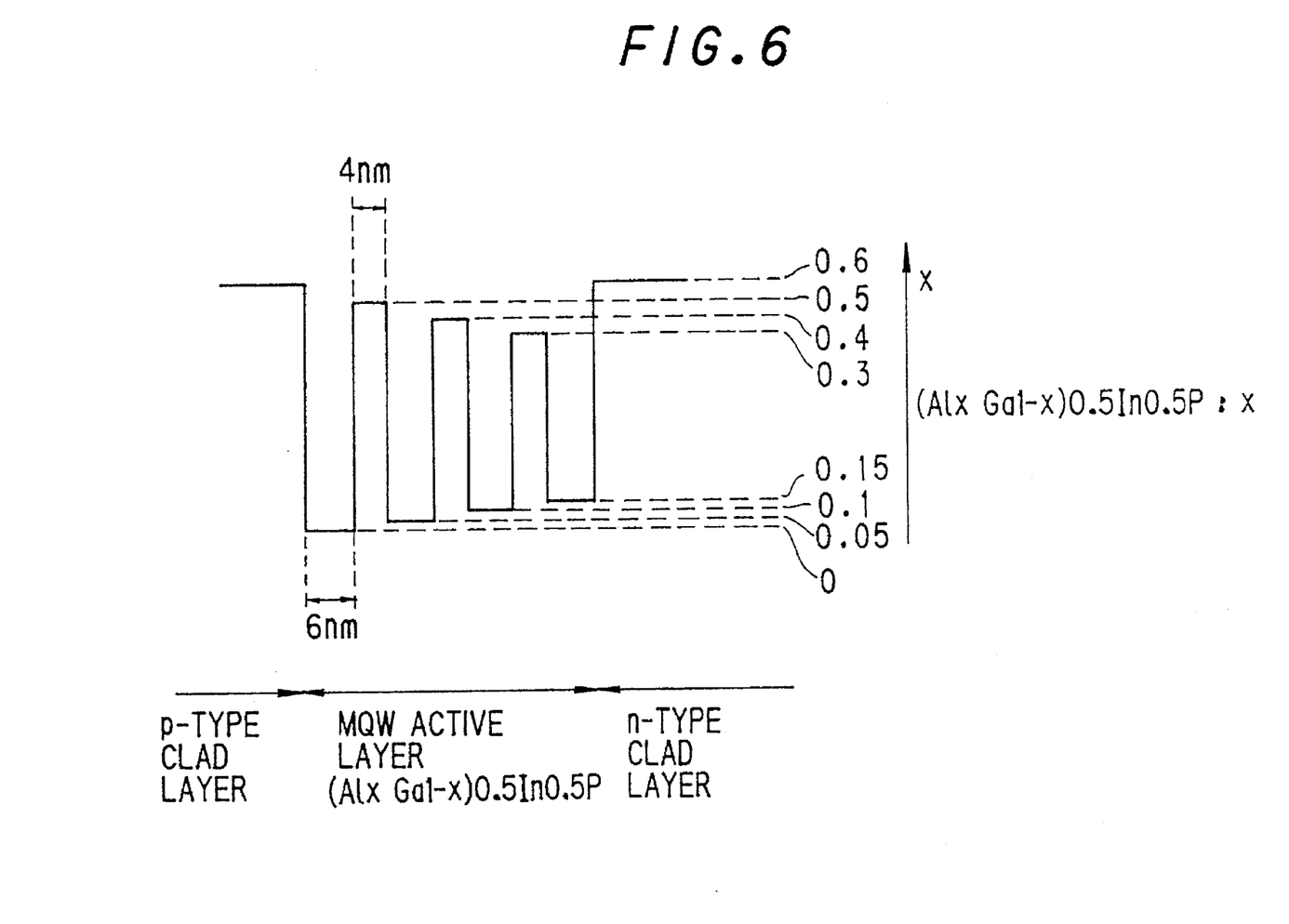
FIG. 6 is a drawing for explaining a structure of an active layer of the semiconductor laser according to the invention.

In the first-step growth by a low-pressure MOVPE method, a 1 μm-thick n-type $(Al_{0.6}Ga_{0.4})_{0.5}In_{0.5}P$ clad layer ($n \approx 5 \times 10^{17}$ $cm^{-3}$) 2, an undoped MQW active layer 3 consisted of four 6 nm-thick $(Al_xGa_{1-x})_{0.5}In_{0.5}P$ well (x=0, 0.05, 0.1 and 0.15 from p-side) and three 4 nm-thick $(Al_yGa_{1-y})_{0.5}In_{0.5}P$ barrier layer (y=0.6, 0.5, and 0.4 from p-side), a 1 μm-thick p-type $(Al_{0.6}Ga_{0.4})_{0.5}In_{0.5}P$ clad layer 4 ($p \approx 5 \times 10^{17}$ $cm^{-3}$), a p-type $Ga_{0.5}In_{0.5}P$ buffer layer 5 and a p-type GaAs cap layer 6 are successively so grown on a Si-doped n-type GaAs substrate 1 ($n \approx 2 \times 10^{18}$ $cm^{-3}$), that lattices of these layers are matched to that of said n-type substrate 1. FIG. 6 shows the structure and composition of the MQW active layer 3 of this embodiment.

In the above mentioned process, a growth temperature, a growth pressure, V/III ratio and a total flow of a carrier gas are 660° C., 70 torr, 150 and 15 l/min respectively. Trimethylindium (TMI: $(C_2H_5)_3In$), triethylgallium (TEG: $(C_2H_5)_3Ga$), trimethylalminium (TMA: $(CH_3)_3Al$), arsine ($AsH_3$), phosphine ($PH_3$), a n-type dopant disilane ($Si_2H_6$) and a p-type dopant dimethylzinc (DMZn: $(CH_3)_2Zn$) are used as the source materials.

Figure 5A:
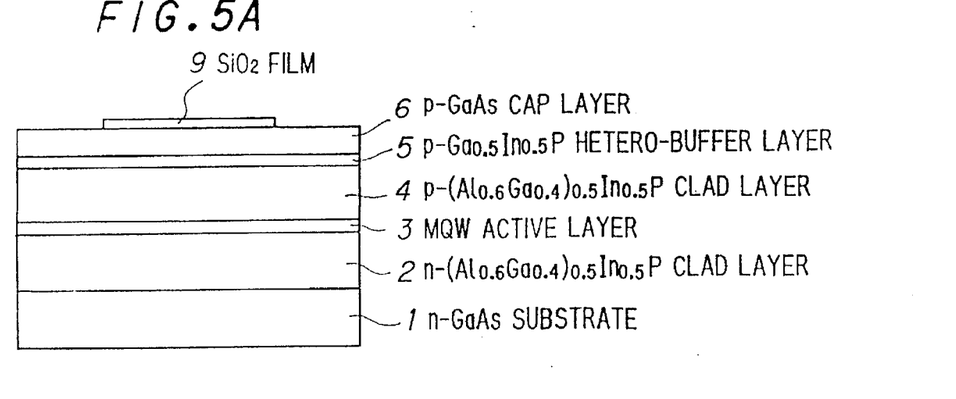
FIGS. 5A to 5E shows a process of fabricating the semiconductor laser according to the invention.
Figure 5B:
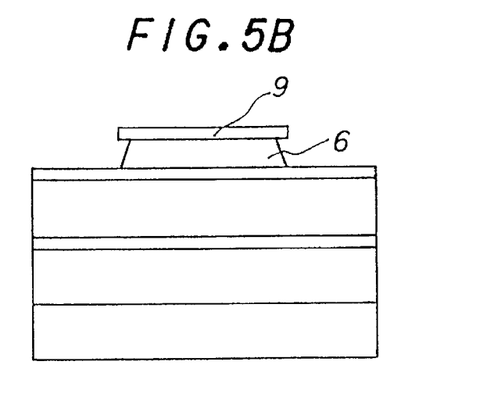
Figure 5C:
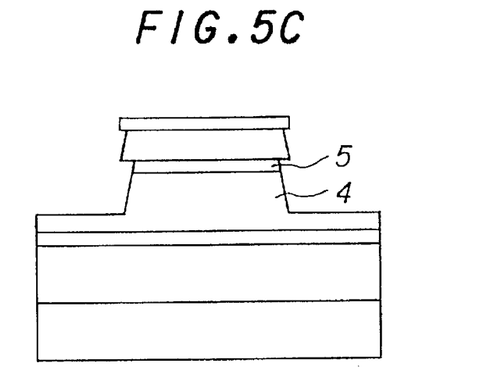

A 5 μm-wide stripe-shaped $SiO_2$ film 9 is formed on the processed substrate thus obtained by means of photolithography, as shown in FIG. 5A. Next, the p-type GaAs cap layer 6 is etched in to a mesa-shape by phosphoric acid with the $SiO_2$ mask 9 on, as shown in FIG. 5B. Then, the p-type $(Al_{0.6}Ga_{0.4})_{0.5}In_{0.5}P$ clad layer 4 is so etched into a mesa-shape by bromic acid that a remained portion of the p-type clad layer 4 by both sides of the mesa become 0.2 μm thick above a p-side boundary surface of the active layer 3, as shown in FIG. 5C.

Figure 5D:
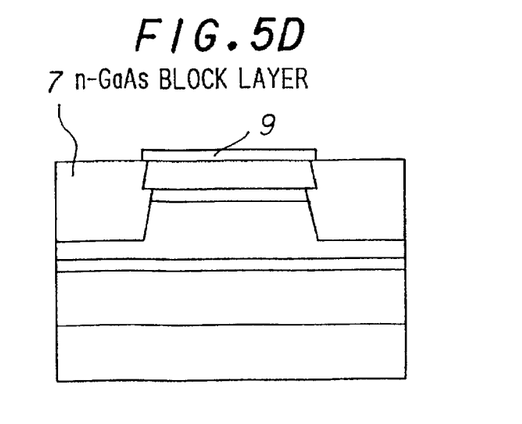
Figure 5E:
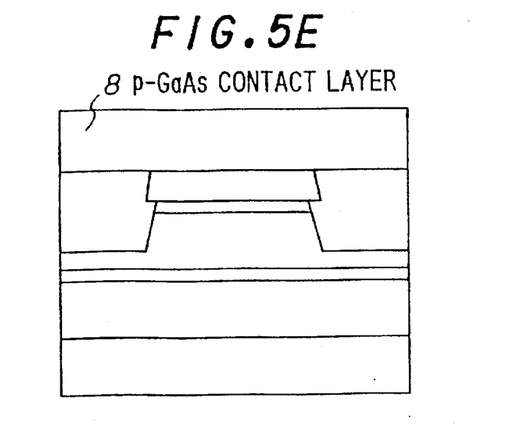

The second-step growth is progressed by a low-pressure MOVPE method with the SiO$_2$ mask 9 on, and a n-type GaAs block layer 7 is grown as shown in FIG. 5D. Then, after eliminating the SiO$_2$ mask 9, a p-type GaAs contact layer 8 is grown by the third-step growth by low-pressure MOVPE method, as shown in FIG. 5E. In the end, by forming p and n-electrodes on the p-type contact layer 8 and the n-type substrate 1 respectively, then cleaving the wafer into 500 μm long cavities and finally separating into individual chips, the fabricating process of semiconductor lasers is completed.

In the above fabrication process, the upper and lower widths of the mesa-portion in the p-type $(Al_{0.6}Ga_{0.4})_{0.5}In_{0.5}P$ clad layer 4 are 3 μm and 5 μm respectively. It should be noted that the refractive index of the MQW active layer 3 is larger than those of the n and p-clad layers 2 and 4, and this feature is common in other later mentioned embodiments according to the invention.

The aforementioned laser according to the invention has a threshold lasing current of 36 mA and an external differential quantum efficiency of 0.7. On the other hand, in a conventional laser with a mesa-width of 3 μm, the former and latter data are 40 mA and 0.67 respectively. It is evident that a worthy improvement can be achieved in the semiconductor laser according to the invention.

In the aforementioned embodiment, the active layer has the MQW structure consisted of four $(Al_xGa_{1-x})_{0.5}In_{0.5}P$ well layers (x=0, 0.05, 0.1 and 0.15 from p-side) and three $(Al_yGa_{1-y})_{0.5}In_{0.5}P$ barrier layers (y=0.6, 0.5 and 0.4 from p-side), and is positioned between the two $(Al_{0.6}Ga_{0.4})_{0.5}In_{0.5}P$ clad layers. The numbers and compositions of the well and barrier layers should be so selected that a nonuniform hole injection can be avoided, and the hole energy level in each quantum well when isolated is equal. The composition and material of the clad layers should be so selected that light and carriers can be effectively contained in the active layer. Moreover, a multilayer clad, such as one with a separate-confinement-hetero (SCH, hereinafter) structure, may be used in accordance with a characteristic required to the laser. The thickness of the remained portion of the clad layer on both sides of the mesa-portion can be precisely controlled by using an etching stop layer.

Besides by the aforementioned ways, it is possible to equalize a biased distribution of holes near the p-type clad layer and transmit holes to wells close to the n-type clad layer, by making the strain, width and energy gap of a quantum well layer and the width and energy gap of a barrier layer vary between the p and n-type clad layers, and thereby holes are uniformly distributed to each quantum well and the laser characteristic is expected to be improved.

Next, cases that the aforementioned structure are applied to other materials such as InGaAsP, GaAs and ZnS compounds will be described.

A fabrication process in a case that InGaAsP compound is used as a source material in a preferred embodiment will be explained referring to appended drawings.

Figure 7:
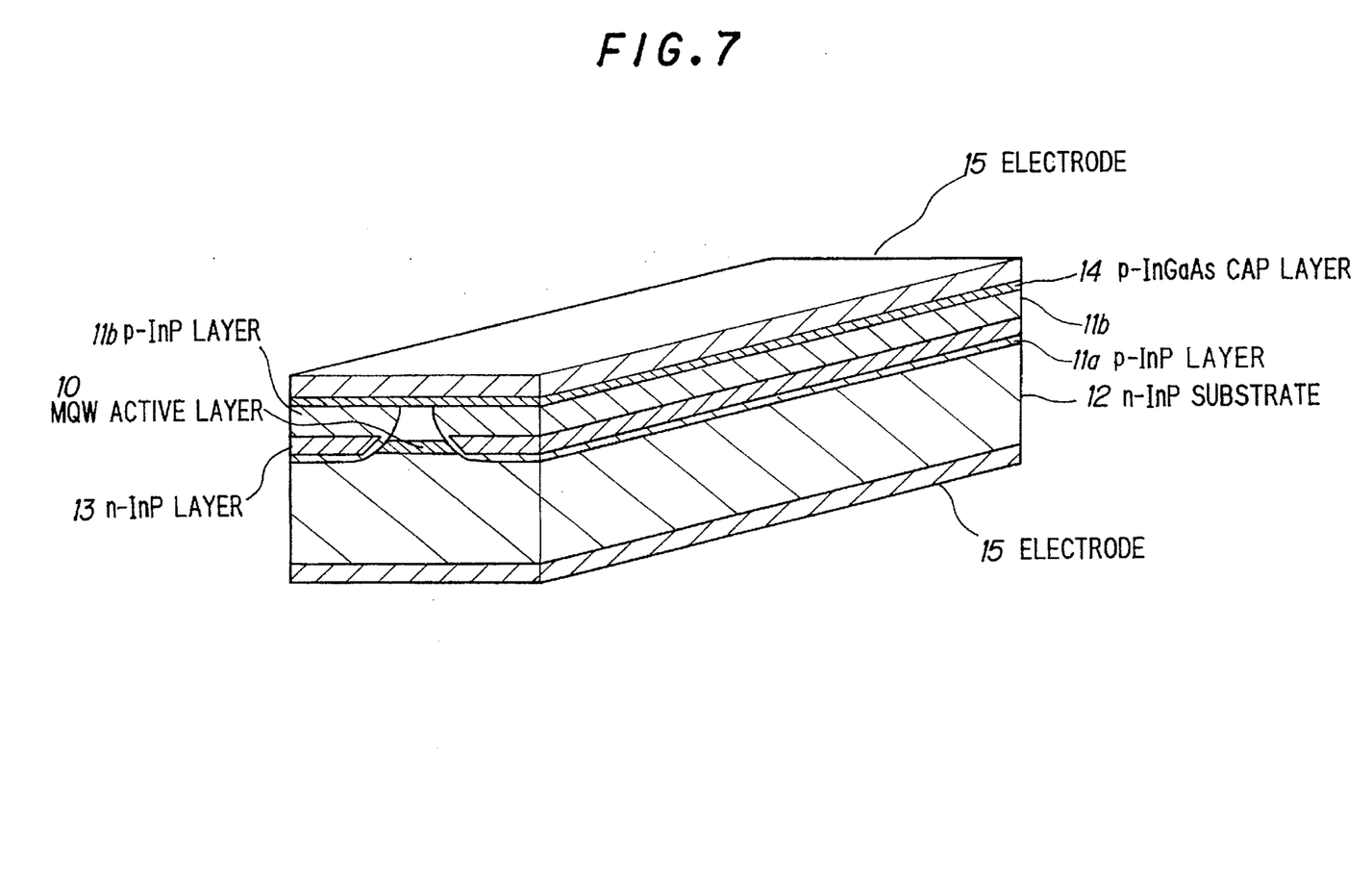
FIG. 7 is a drawing for explaining a semiconductor laser according to the invention as a preferred embodiment.

FIG. 7 shows a cross-sectional view showing the structure of the preferred embodiment. A 100 nm thick undoped InGaAsP layer (1.15 μm wavelength composition), a 7 nm thick undoped InGaAsP layer, a 10 nm thick undoped InGaAsP layer (1.2 μm wavelength composition), a 7.5 nm thick undoped InGaAsP layer, a 10 nm thick undoped InGaAsP layer (1.25 μm wavelength composition), a 8 nm thick undoped InGaAsP layer, a 10 nm thick undoped InGaAsP layer (1.3 μm wavelength composition), a 8.5 nm thick undoped InGaAsP layer, a 10 nm thick undoped InGaAsP layer (1.35 μm wavelength composition), a 9 nm thick undoped InGaAsP layer, a 100 nm thick undoped InGaAsP layer (1.35 μm wavelength composition), and a 500 nm thick a p-type InP layer (carrier concentration $\approx 5 \times 10^{17}$ cm$^{-3}$), successively on a n-type substrate 12 (carrier concentration $\approx 5 \times 10^{17}$ cm$^{-3}$) by a low-pressure MOVPE method. A structure and wavelength compositions of the MQW active layer 10 is shown on FIG. 8. After a SiO$_2$ film is deposited on the processed substrate by a thermal CVD method, the mesa with an upper width of 1 μm is formed by a photoresist and a chemical etching with brommenthanol. Then, remaining the SiO$_2$ film on the mesa top, a p-type InP layer 11a (carrier concentration $\approx 5 \times 10^{17}$ cm$^{-3}$), a n-type InP layer 13 (carrier concentration $\approx 5 \times 10^{17}$ cm$^{-3}$), and a p-type InP layer 11b (carrier concentration $\approx 5 \times 10^{17}$ cm$^{-3}$) are successively grown on the whole surface.

After eliminating the SiO$_2$ film of the mesa top by buffered fluoric acid, a p-type InGaAs cap layer 14 (carrier concentration $\approx 1 \times 10^{19}$ cm$^{-3}$) is again grown by a MOVPE growth technology and a buried type laser diode structure is obtained. The substrate is polished 150 μm thick and Ti/Au electrodes are deposited on both surfaces of the processed substrate by spattering, and chips are completed with a alloy treatment at 460° C.

Moreover, chips with layer structures, which is shown in FIGS. 9–12, are fabricated by similar burying processes. In a structure shown in FIG. 9, carriers are made to be uniformly distributed in wells by controlling compressive strains of respective wells. Wavelength compositions of barrier and SCH layers are 1.15 μm ones and wells are composed of InGaAs with different compressive strains. In this structure, carriers can be uniformly distributed in all wells by adopting such a structure that the wavelength composition of each barrier layer constructing a MQW active layer is constant, but only the compressive strain of each well is different.

Figure 10:
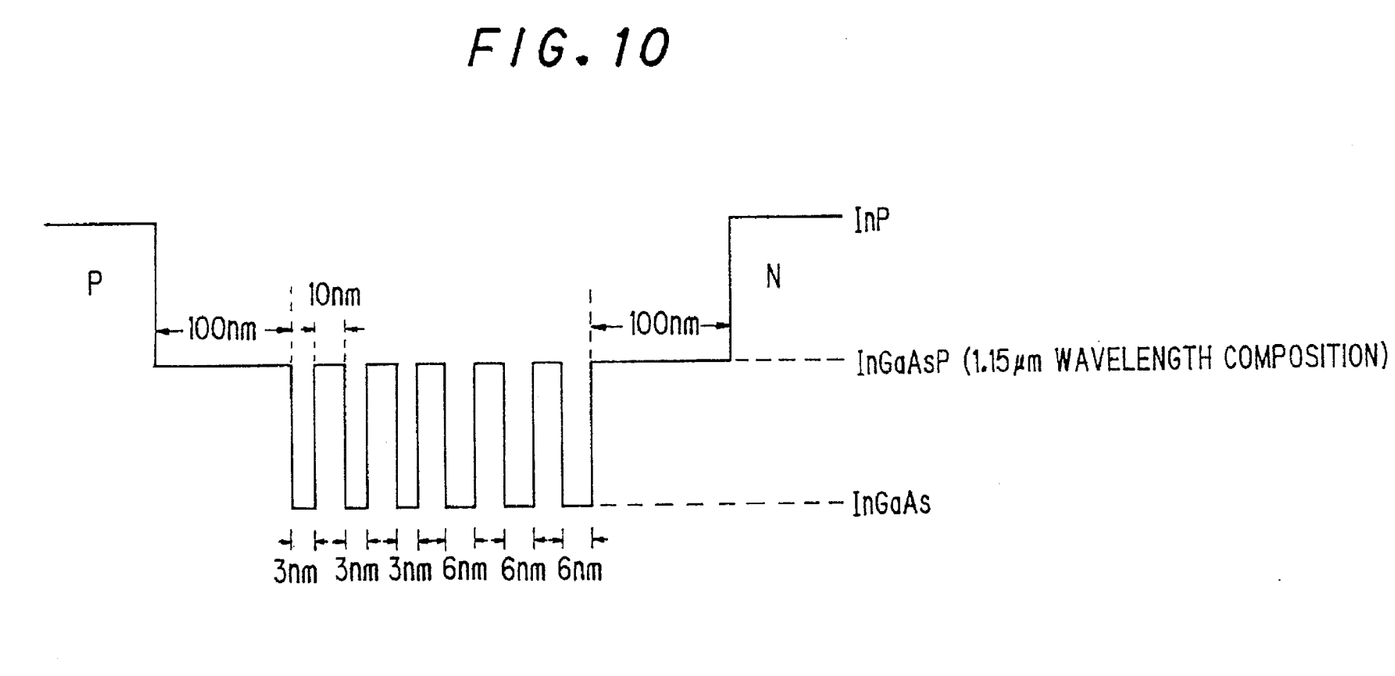
FIG. 10 is a drawing for explaining a structure of an active layer of a semiconductor laser according to the invention.
Figure 11:
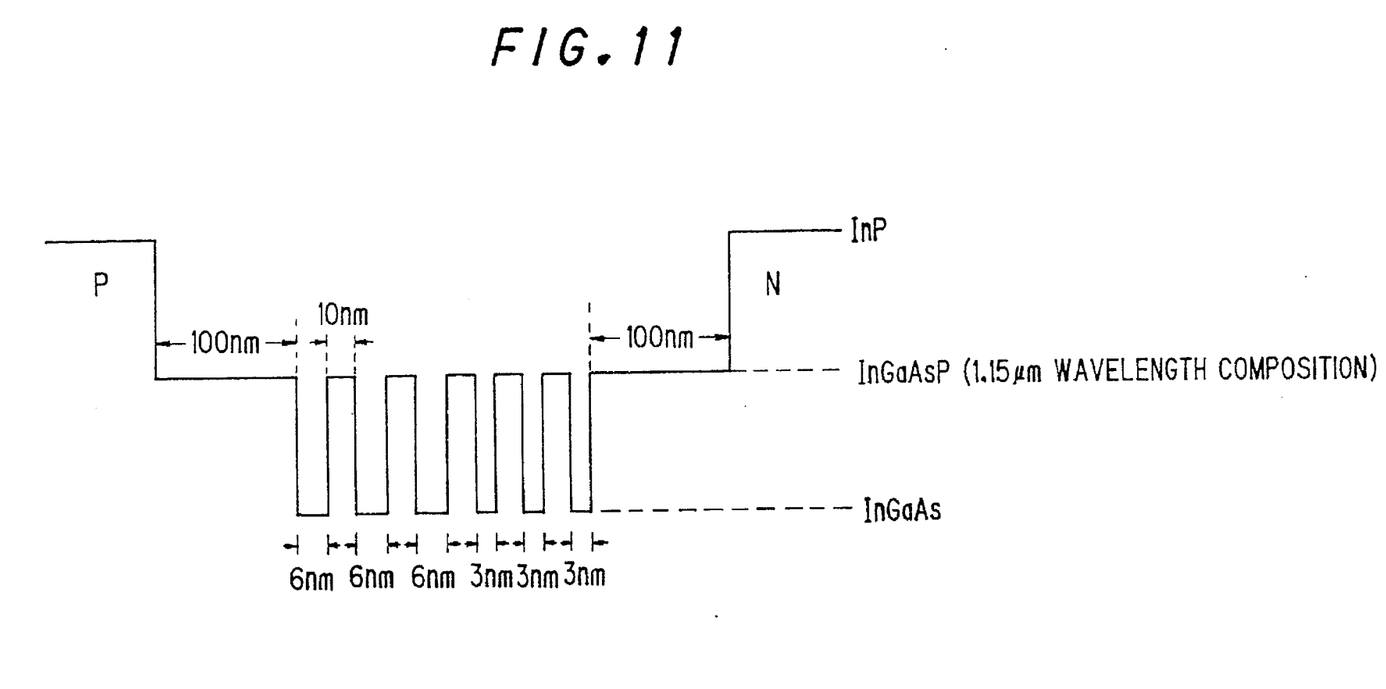
FIG. 11 is a drawing for explaining a structure of an active layer of a semiconductor laser according to the invention.

In structures shown in FIGS. 10 and 11, biased distributions of carriers are avoided by changing widths of wells. 1.15 μm wavelength composition InP is adopted in barrier and SCH layers, and InGaAs with no strain is used in quantum wells.

Figure 12:
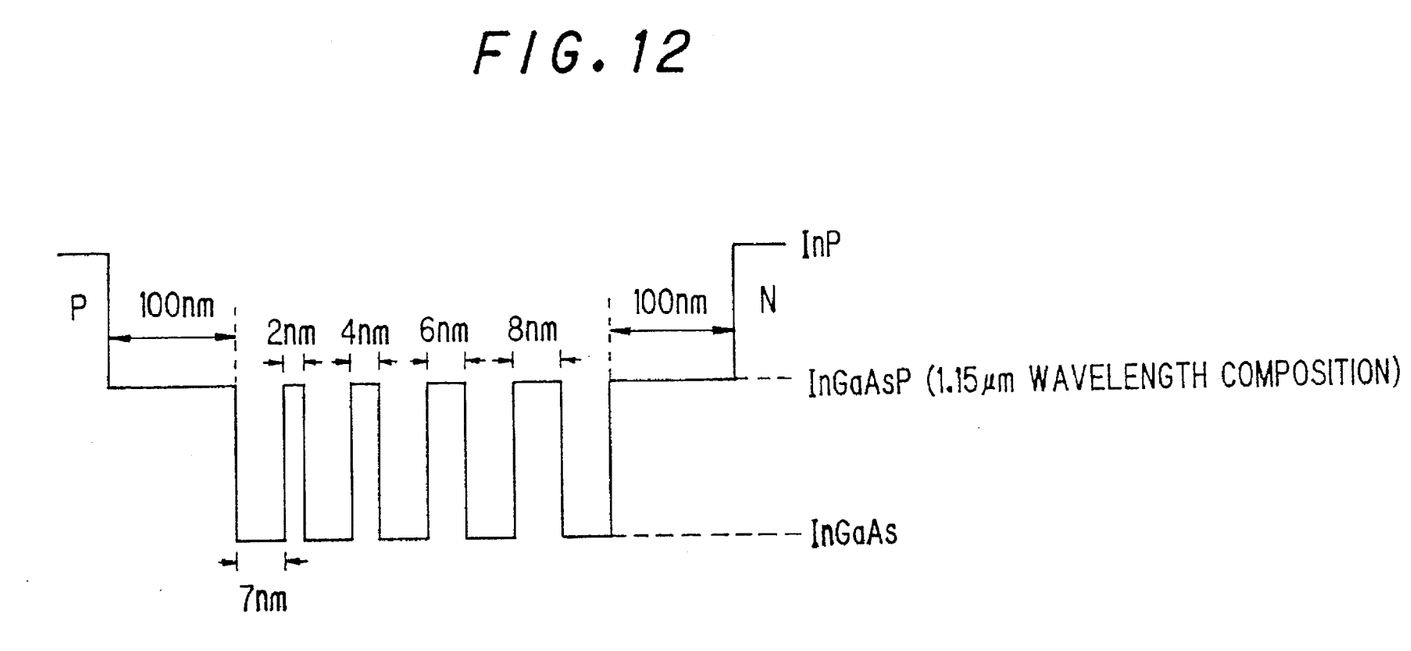
FIG. 12 is a drawing for explaining a structure of an active layer of a semiconductor laser according to the invention.

In a structure shown in FIG. 12, thicknesses of barrier layers near wells containing a large number of holes are made to be thin to obtain a uniform carrier distribution, wherein barrier and SCH layers are 1.15 μm thick and wells are consisted of InGaAs layers with no strains.

Figure 8:
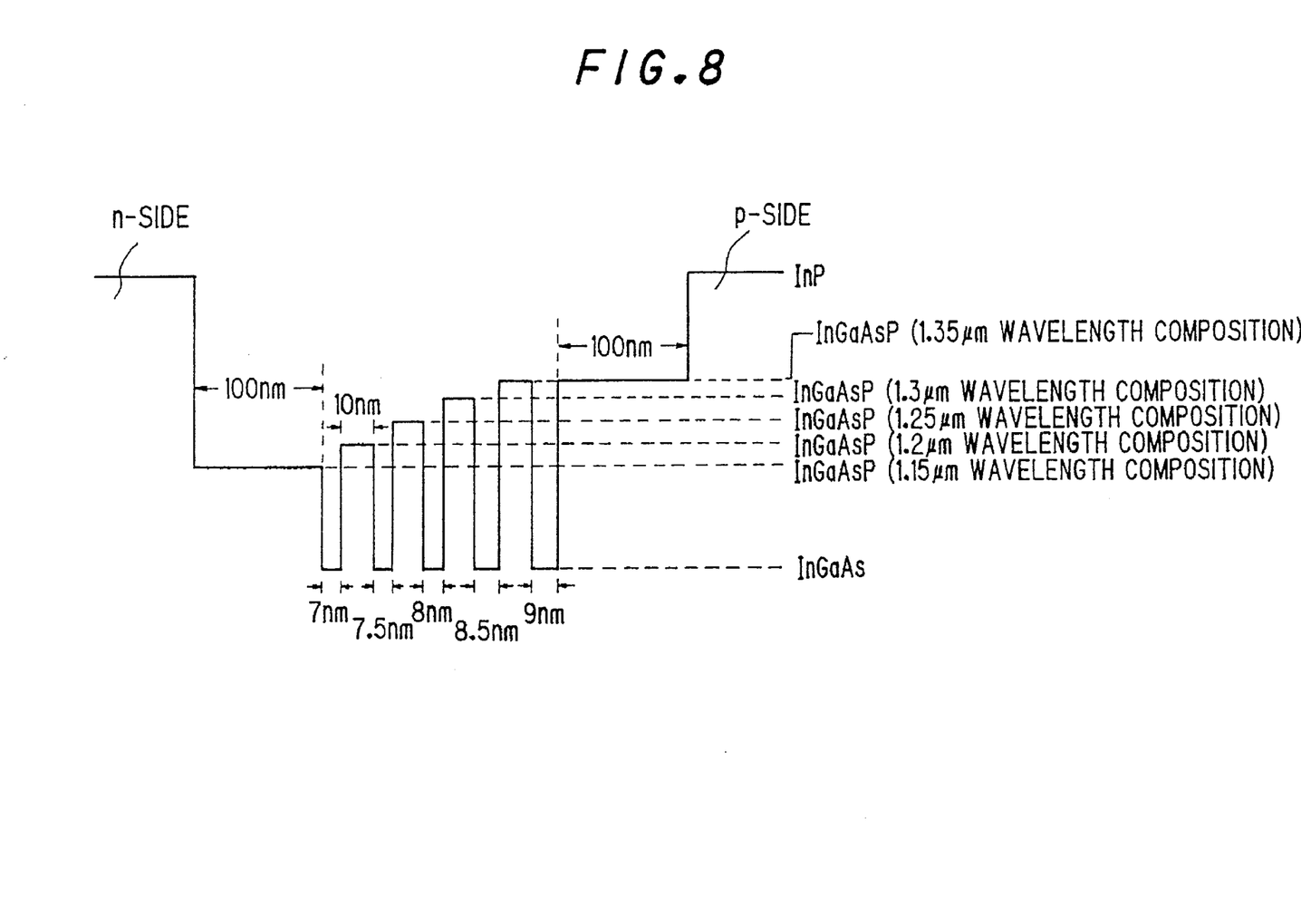
FIG. 8 is a drawing for explaining a structure of an active layer of a semiconductor laser according to the invention.
Figure 9:
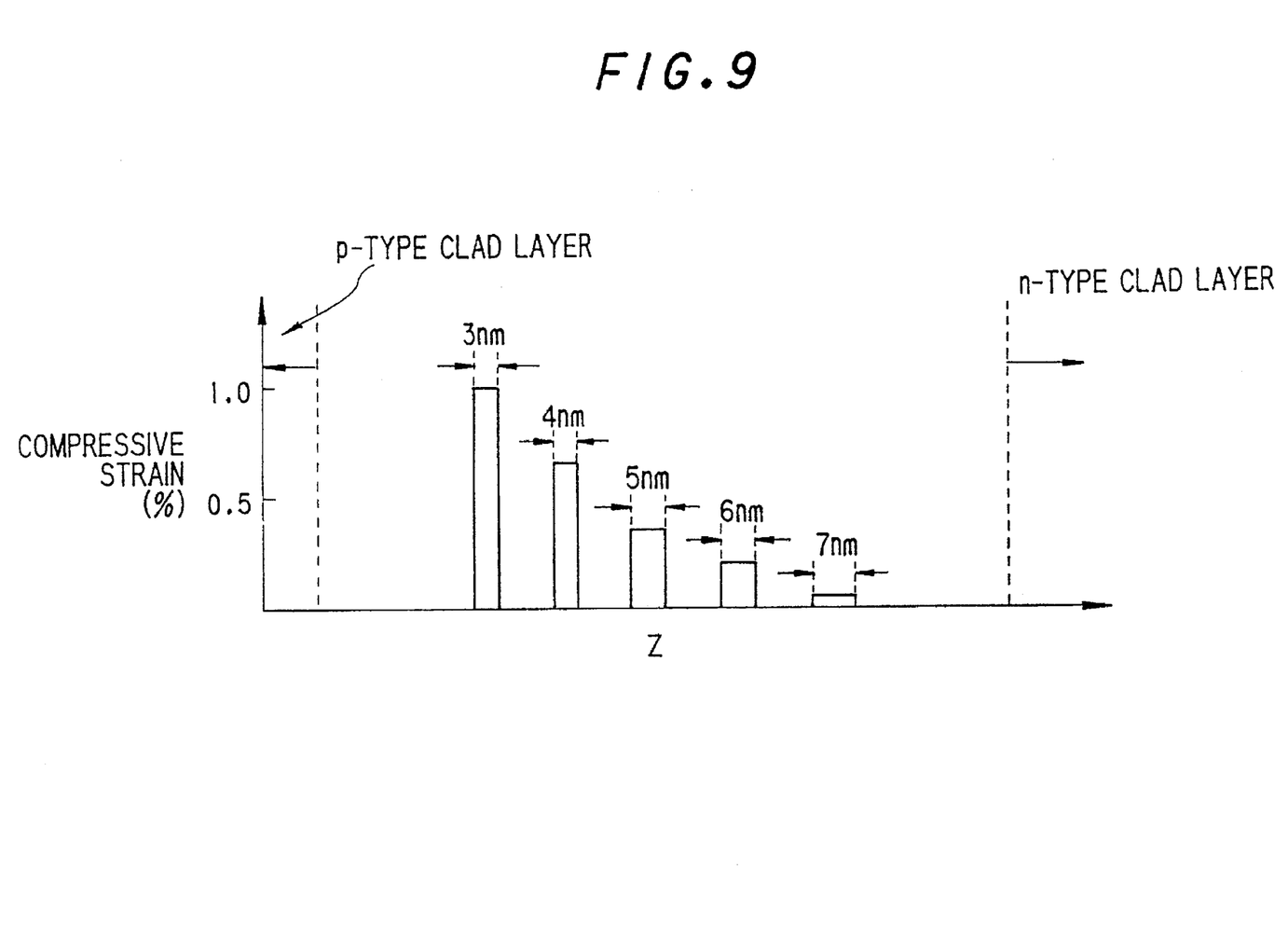
FIG. 9 is a drawing for explaining a structure of an active layer of a semiconductor laser according to the invention.

A laser with a structure shown in FIG. 8 is fabricated by adopting MQW active layer with such a structure that a biased distribution of carriers can be voided. By cleaving a substrate thus obtained, 300 μm long cavities are obtained, and characteristics of a typical one of them is estimated. Satisfactory results obtained are that, a threshold lasing current is 5 mA and an external differential quantum efficiency is about 0.3 W/A.

Figure 13:
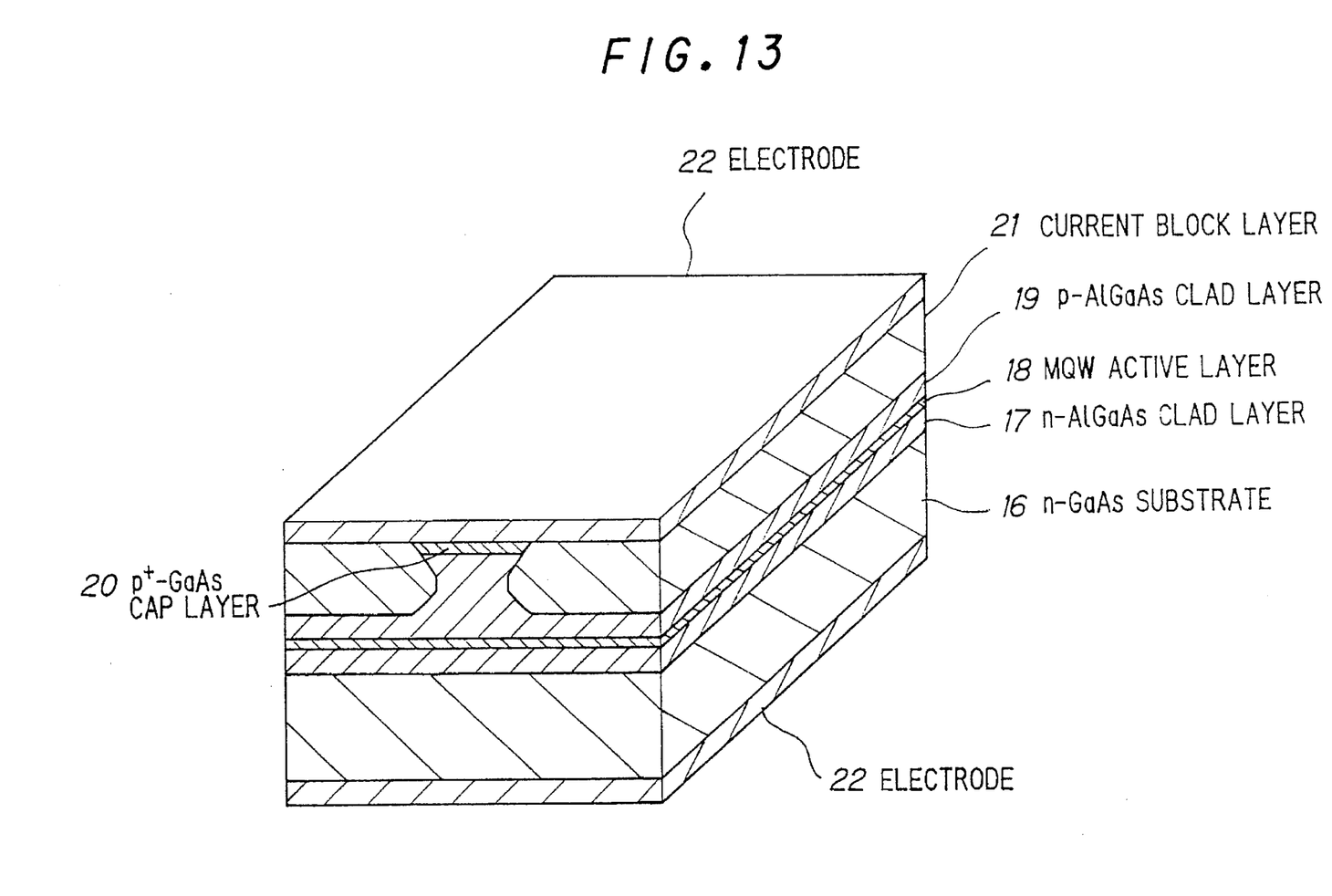
FIG. 13 is a drawing for explaining a semiconductor laser according to the invention.

Next, a 0.98 μm-band laser diode according to the invention will be explained as a preferred embodiment. FIG. 13 shows a cross-sectional view of this laser diode. A n-type GaAs clad layer 17, a MQW active layer 18 composed of AlGaAs/InGaAs, a p-type AlGaAs clad layer 19 and a p$^+$-GaAs cap layer 20 are successively grown on a n-type GaAs substrate 16 by a MOVPE technology. Then, after a upper portion of the processed substrate above the active layer 18 is etched remaining a mesa-stripe portion, current block layers 21s are buried by a MOVPE selective growth technology, and electrodes 22s are formed on upper and lower surfaces. In the AlGaAs/InGaAs MQW active layer, heights of barriers are changed by selecting a Al content of AlGaAs of a barrier layer in accordance with a diagram shown in FIG. 6. Laser diodes are fabricated from 300 µm long cavities which is obtained by cleaving the processed substrate thus obtained. Characteristics of several typical diodes are estimated, and results show that threshold lasing currents are lower than 7 mA.

Figure 14:
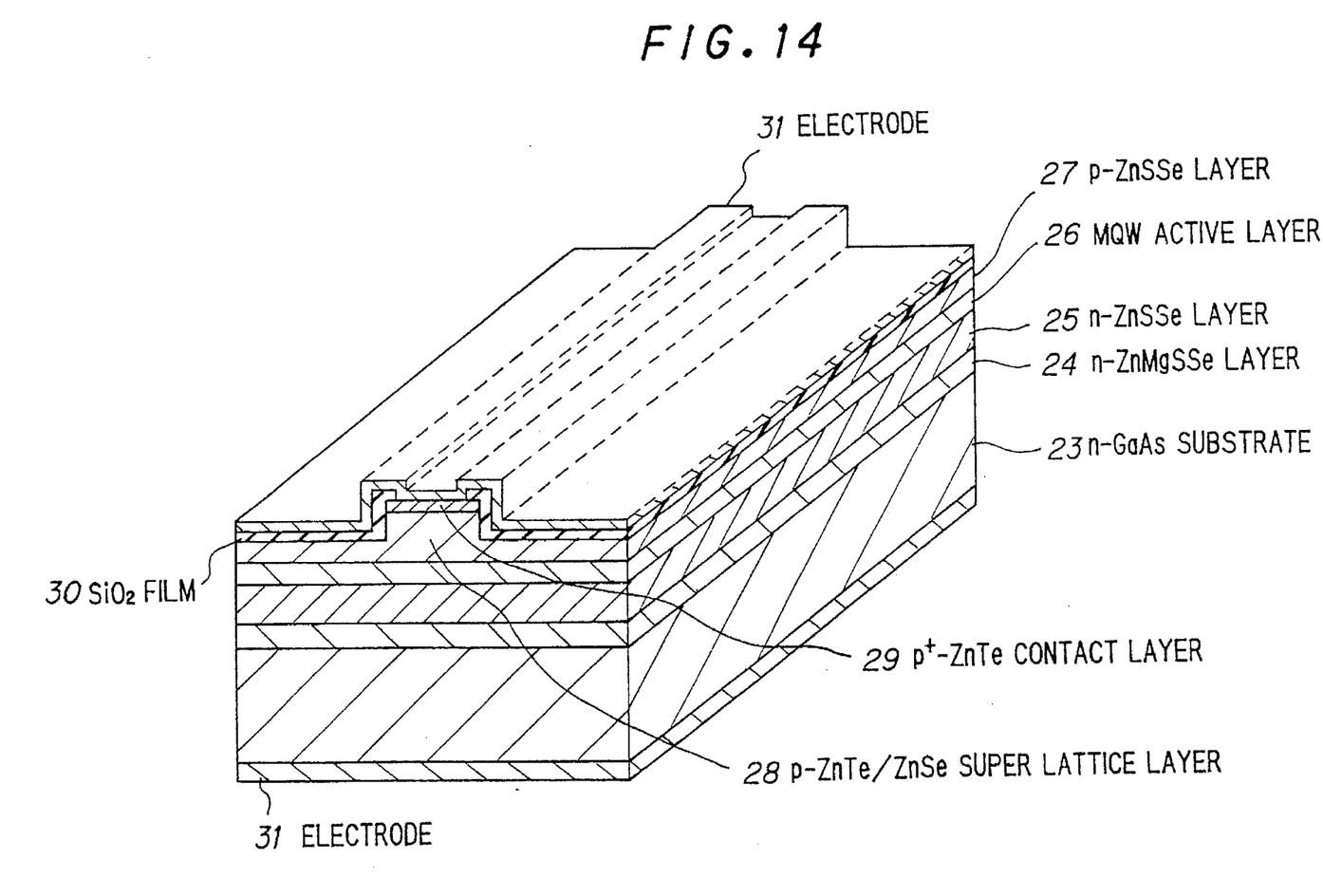
FIG. 14 is a drawing for explaining a semiconductor laser according to the invention.

Finally, a case that ZnSe compound is used in a structure according to the invention as one of important source materials. A 0.1 µm thick n-type ZnMgSSe layer 24 (carrier concentration $\approx 5\times 10^{17}$ cm$^{-3}$), a 0.2 µm thick n-type ZnSSe layer 25 (carrier concentration $\approx 5\times 10^{17}$ cm$^{-3}$), a ZnCdSe MQW active layer 26, a 0.2 µm thick p-type ZnSSe layer 27 (carrier concentration $\approx 5\times 10^{17}$ cm$^{-3}$) and a 0.1 µm thick (a total thickness) p-type ZnTe/ZnSe super lattice layer 28 (carrier concentration $\approx 5\times 10^{17}$ cm$^{-3}$) and a 0.1 µm thick p$^+$-type ZnTe contact layer 29 (carrier concentration $\approx 2\times 10^{17}$ cm$^{-3}$) are successively grown on a n-type substrate 23 by a molecular beam epitaxial (MBE) method. Then, ridge-shaped wave guide is formed by processes of photolithography and wet-etching. A SiO$_2$ film 30 is formed on a upper surface of the processed substrate, then this film laying on the top portion of the ridge is eliminated by an etching and Ti/Au electrodes 31s are deposited on the both surfaces of the processed substrate. Laser diodes are fabricated from 300 µm long cavities obtained by cleaving the processed substrate. Characteristics of several typical diodes are estimated, and results show that lasing threshold currents are lower than 7 mA at a 490 nm lasing wavelength.

As described in the above, a semiconductor laser diode with a low threshold lasing current and a high external differential quantum efficiency can be provided according to the invention.

Although the invention has been described with respect to specific embodiment for complete and clear disclosure, the appended claims are not to be thus limited but are to be construed as embodying all modification and alternative structures that may be occur to one skilled in the art which fairly fall within the basic teaching here is set forth.

What is claimed is:

1. A semiconductor laser with a double hetero-structure comprising:

a multiple quantum well active layer in which strains in quantum well layers are expressed by a monotonous function, being either increasing or decreasing, between p and n-type clad layers, and said p and n-type clad layers having smaller refractive indexes compared with that of said multiple quantum well active layer.

2. A semiconductor laser comprising a double hetero-structure provided on a semiconductor substrate, said double hetero-structure comprising an active layer of a multiple quantum well structure comprising quantum well layers and barrier layers alternately provided; a first optical guide layer of a first type conductivity provided on a first side of said active layer; and a second optical guide layer of a second type conductivity provided on a second side of said active layer, said second type conductivity being opposite to said first type conductivity, and said second side being opposite to said first side;

wherein strain amounts of said quantum well layers are graded between said first and second optical guide layers.

* * * * *